US012769287B2

(12) United States Patent
Pandey et al.

(10) Patent No.: US 12,769,287 B2
(45) Date of Patent: Oct. 20, 2026

(54) SOCKET-DEPENDENT ELECTRONIC MODULE ASSEMBLY DESIGN AND FABRICATION

(71) Applicant: INTERNATIONAL BUSINESS MACHINES CORPORATION, Armonk, NY (US)

(72) Inventors: Nilesh Pandey, Allen, TX (US); Oswald J. Mantilla, Dutchess, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 205 days.

(21) Appl. No.: 18/937,224

(22) Filed: Nov. 5, 2024

(65) Prior Publication Data

US 2026/0202825 A1 Jul. 16, 2026

(51) Int. Cl.
*G05B 19/418* (2006.01)
*G06F 30/398* (2020.01)

(52) U.S. Cl.
CPC ..... *G05B 19/41805* (2013.01); *G06F 30/398* (2020.01); *G05B 2219/35027* (2013.01)

(58) Field of Classification Search
CPC .... G05B 19/41805; G05B 2219/35027; G06F 30/398
See application file for complete search history.

(56) References Cited

U.S. PATENT DOCUMENTS

| | | | |
|---|---|---|---|
| 7,231,361 | B2 | 6/2007 | Eck et al. |
| 7,653,452 | B2 | 1/2010 | Sauermann et al. |
| 10,915,844 | B2 | 2/2021 | Geroulo et al. |
| 11,037,103 | B1 | 6/2021 | Shilovitsky |

(Continued)

FOREIGN PATENT DOCUMENTS

CN 112084706 A * 12/2020 ............ G06F 30/27

OTHER PUBLICATIONS

F. C. Lee and Dengming Peng, "Power electronics building block and system integration," Proceedings IPEMC 2000. Third International Power Electronics and Motion Control Conference (IEEE Cat. No.00EX435), Beijing, China, 2000, pp. 1-8 vol.1, doi: 10.1109/IPEMC.2000.885325. (Year: 2000).*

(Continued)

*Primary Examiner* — Michael D Masinick
(74) *Attorney, Agent, or Firm* — Edward Wixted, Esq.; Kevin P. Radigan, Esq.; Heslin Rothenberg Farley & Mesiti P.C.

(57) ABSTRACT

A module-socket-dependent assembly design process is provided which includes obtaining, by an assembly design engine, socket-dependent substitution rules indicating where a different electronic module type can be used for another electronic module type at a particular socket in an electronic module assembly configuration absent violating a power constraint of a respective electronic assembly design. The assembly design includes multiple electronic module sockets to accommodate multiple electronic modules of the electronic module assembly configuration. The process further includes automatically generating an updated electronic module assembly configuration using at least one substitution rule of the socket-dependent substitution rules, where the other electronic module type of the electronic module assembly configuration is replaced at the particular socket of the multiple sockets with the different electronic module type. Further, the process includes initiating fabricating of an electronic assembly using the updated electronic module assembly configuration of the electronic assembly design.

20 Claims, 13 Drawing Sheets

(56) References Cited

U.S. PATENT DOCUMENTS

| | | | | |
|---|---|---|---|---|
| 11,556,895 | B2 | 1/2023 | Notani et al. | |
| 11,748,707 | B2 | 9/2023 | Suguiura et al. | |
| 2006/0173728 | A1* | 8/2006 | An | G06Q 10/06313<br>705/7.22 |
| 2007/0162171 | A1 | 7/2007 | Mcdonald et al. | |
| 2009/0125373 | A1 | 5/2009 | Lukes et al. | |
| 2009/0307026 | A1 | 12/2009 | Ervolina et al. | |
| 2010/0064297 | A1* | 3/2010 | Doll | H04L 12/403<br>719/315 |
| 2011/0029345 | A1 | 2/2011 | Kienzle | |
| 2015/0120370 | A1 | 4/2015 | Agrawal et al. | |
| 2022/0092537 | A1 | 3/2022 | Li et al. | |
| 2022/0358451 | A1* | 11/2022 | Huang | G06N 3/092 |
| 2023/0307867 | A1* | 9/2023 | Chin | H01R 13/5219 |
| 2026/0202825 | A1* | 7/2026 | Pandey | G05B 19/41805 |

OTHER PUBLICATIONS

Mahmoudi, Hamid, Mohsen Aleenejad, and Reza Ahmadi. "Reconfigurable rapid prototyping platform for power electronic circuits and systems for research and educational purposes." IET Power Electronics 11.7 (2018): 1314-1320. (Year: 2018).*

Damand et al. "A Simulation-Optimization Approach to Parameterize Demand-Driven Material Requirements Planning", IFAC—PapersOnLine, Jun. 22-24, 2022, pp. 263-268, vol. 55, Issue 10.

Kortabarria et al. "Material Management Without Forecasting: From MRP To Demand Driven MRP", Journal of Industrial Engineering and Management, Jul. 2018, pp. 632-650, vol. 11, Issue No. 4.

Lee et al. "A High Performance MRP Part Explosion Process Using Computational Grid in A Distributed Database Environment", 19th International Conference on Production Research, Jul. 31, 2015, 6 pages.

Reis João. "Exploring Applications and Practical Examples by Streamlining Material Requirements Planning (MRP) With Python", Logistics, Dec. 1, 2023, 19 pages, vol. 7, Issue. 4.

Xu et al. "An Efficient Production Planning Approach Based Demand Driven MRP Under Resource Constraints", International Journal of Industrial Engineering Computations, May 26, 2023, pp. 451-466, vol. 14, Issue. 3.

* cited by examiner

| | SOCKET A | SOCKET B | SOCKET C | SOCKET D |
|---|---|---|---|---|
| | | | | |
| CONFIG 1 57W 2033 WATTS | 0000003LV025 | 0000003LV026 | 0000003LV027 | 0000003LV028 |
| | | | | |
| | 14M | 14M | 14M | 15M |
| | 14L | 14L | 14L | 15L |
| | 15L | 15L | 15L | |
| | 15M | 15M | 15M | |
| | | | | |
| | | | | |
| CONFIG 2 57W 2033 WATTS | 0000003LV029 | 0000003LV030 | 0000003LV031 | 0000003LV032 |
| | | | | |
| | 15H | 14H | 14L | 15L |
| | 15M | 14M | 15L | 15M |
| | 15L | 14L | | |
| | | 15H | | |
| | | 15M | | |
| | | 15L | | |
| | | | | |
| | | | | |
| CONFIG 3 57W 2033 WATTS | 0000003LV033 | 0000003LV034 | 0000003LV035 | 0000003LV036 |
| | | | | |
| | 14L | 14L | 14H | 15H |
| | 15L | 15L | 14M | 15M |
| | | | 14L | 15L |
| | | | 15H | 14H |
| | | | 15M | 14M |
| | | | 15L | 14L |
| | | | | |
| | | | | |
| CONFIG 4 57W 2001 WATTS | 0000003LV037 | 0000003LV038 | 0000003LV039 | 0000003LV040 |
| | | | | |
| | 14L | 14L | 14L | 15G |
| | 15L | 15L | 15L | 15L |
| | | | | |
| | | | | |
| CONFIG 5 57W 1978 WATTS | 0000003LV041 | 0000003LV042 | 0000003LV043 | 0000003LV044 |
| | | | | |
| | 14G | 14G | 14G | 15G |
| | 15G | 15G | 15G | |

6 WAYS OF BUILDING 57W WITH 3 OFFERINGS
(18 SOCKETS TO ACCOUNT FOR)

FIG. 5A

| | SOCKET A | SOCKET B | SOCKET C | SOCKET D |
|---|---|---|---|---|
| EXAMPLE 57W | 14M | 14M | 14M | 15L |
| | 14L | 15H | 14L | 15H |
| | 15L | 15L | 15L | |
| | 15M | 15M | 15M | |

FIG. 5B

| DRAWER DESIGN STRUCTURE | |
|---|---|
| | |
| MFGPN | MATLS PART # |
| DRAWER | CONFIG |
| | |
| | |
| 00000ZADR57H | 00000ZADR57H1 |
| 00000ZADR57H | 00000ZADR57H2 |
| 00000ZADR57H | 00000ZADR57H3 |
| | |
| 00000ZADR57M | 00000ZADR57M1 |
| | |
| | |
| 00000ZADR57L | 00000ZADR57L1 |

FIG. 6B

| CONFIG | CONFIG |
|---|---|
| LV91 | LV91 |
| 0000ZADR57H1 | 0000003LV024 |
| 0000ZADR57H1 | 0000003LV025 |
| 0000ZADR57H1 | 0000003LV026 |
| 0000ZADR57H1 | 0000003LV027 |

FIG. 6C

| SUB RULES | | | |
|---|---|---|---|
| | | | |
| PARTNUM | SUB-PN | START_DATE | SUB_QTY |
| | | | |
| | | | |
| 0000003LV024 | 03JM823 | XX-XX-XXXX | 1 |
| 0000003LV024 | 03JM824 | XX-XX-XXXX | 1 |
| 0000003LV024 | 03JM817 | XX-XX-XXXX | 1 |
| | | | |
| 0000003LV025 | 03JM823 | XX-XX-XXXX | 1 |
| 0000003LV025 | 03JM824 | XX-XX-XXXX | 1 |
| 0000003LV025 | 03JM817 | XX-XX-XXXX | 1 |
| | | | |
| 0000003LV026 | 03JM823 | XX-XX-XXXX | 1 |
| 0000003LV026 | 03JM824 | XX-XX-XXXX | 1 |
| 0000003LV026 | 03JM817 | XX-XX-XXXX | 1 |
| | | | |
| | | | |
| 0000003LV027 | 03JM816 | XX-XX-XXXX | 1 |
| 0000003LV027 | 03JM817 | XX-XX-XXXX | 1 |

FIG. 6D

SOCKET-DEPENDENT ELECTRONIC MODULE ASSEMBLY DESIGN AND FABRICATION

BACKGROUND

The present invention relates to the design and manufacture of electronic module assemblies, and more particularly, to efficient design and manufacture of power-constrained electronic module assemblies, with one or more possible socket-dependent, electronic module assembly configurations.

Electronic computer-aided design (ECAD), or electronic design automation (EDA), is a class of design tools for designing various levels of electronic systems, including, for instance, integrated circuits, printed circuit boards, and electronic assembly layouts, such as for a server drawer of an information technology (IT) rack. In one or more embodiments, EDA tools can be used to evaluate incoming designs, such as electronic assembly designs, for manufacturing readiness. Electronic assembly design processes typically include component assignment/placement, component mounting, interconnect layout, pick and place assembly and operational test and verification.

SUMMARY

Certain shortcomings of the prior art are overcome, and additional advantages are provided herein through the provision of a method which includes obtaining, by an assembly design engine, socket-dependent substitution rules for a power-constrained electronic assembly design indicating where a different electronic module type of a plurality of electronic module types can be used in place of another electronic module type at a particular socket in an electronic module assembly configuration absent violating a power constraint of the electronic assembly design. The electronic assembly design includes multiple electronic module sockets to accommodate multiple electronic modules of the electronic module assembly configuration. The method further includes automatically generating, by the assembly design engine, an updated electronic module assembly configuration for the electronic assembly design using at least one substitution rule of the socket-dependent substitution rules, where the other electronic module type of the electronic module assembly configuration is replaced at the particular socket of the multiple sockets with the different electronic module type of the plurality of electronic module types. Further, the method includes initiating fabricating of an electronic assembly using the updated electronic modules assembly configuration of the electronic assembly design.

Computer program products and computer systems relating to one or more aspects are also described and claimed herein. Further, services relating to one or more aspects are also described and may be claimed herein.

Additional features and advantages are realized through the techniques described herein. Other embodiments and aspects are described in detail herein and are considered a part of the disclosed inventive aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

FIG. 5A depicts an exemplary data structure of electronic module assembly configurations for a power-constrained electronic assembly design to be optimized, in accordance with one or more aspects of the present disclosure;

FIG. 5B is an exemplary data structure of electronic module assembly configurations for one power-constrained electronic assembly design, in accordance with one or more aspects of the present disclosure;

FIG. 6B depicts an exemplary data structure of unique configuration identifiers assigned to different electronic module assembly configurations of FIG. 6A, in accordance with one or more aspects of the present disclosure;

FIG. 6C depicts an exemplary data structure of respective socket identifiers associated with certain unique configuration identifiers of an exemplary electronic module assembly configuration to provide socket-dependent information, in accordance with one or more aspects of the present disclosure;

FIG. 6D depicts an exemplary data structure of socket-dependent substitution rules for an assembly design engine for use in automatically generating an updated electronic module assembly configuration, in accordance with one or more aspects of the present disclosure;

DETAILED DESCRIPTION

Aspects of the present disclosure and certain features, advantages, and details thereof, are explained more fully below with reference to the non-limiting example(s) illustrated in the accompanying drawings. Descriptions of well-known software, systems, devices, processing techniques, tools, etc., are omitted so as not to unnecessarily obscure the disclosure in detail. It should be understood, however, that the detailed description and the specific example(s), while indicating aspects of the disclosure, are given by way of illustration only, and are not by way of limitation. Various substitutions, modifications, additions, and/or arrangements, within the spirit and/or scope of the underlying inventive concepts will be apparent to those skilled in the art for this disclosure. Note further that reference is made below to the drawings, where the same or similar reference numbers used throughout different figures designate the same or similar components. Also, note that numerous inventive aspects and features are disclosed herein, and unless otherwise inconsistent, each disclosed aspect or feature is combinable with any other disclosed aspect or feature as desired for a particular application of the concepts disclosed.

Note also that illustrative embodiments are described below using specific code, designs, architectures, protocols, layouts, schematics, systems, or tools only as examples, and not by way of limitation. Furthermore, the illustrative embodiments are described in certain instances using particular software, hardware, tools, and/or data processing environments only as example for clarity of description. The illustrative embodiments can be used in conjunction with other comparable or similarly purposed structures, systems, applications, architectures, tools, engines, etc. One or more aspects of an illustrative embodiment can be implemented in software, hardware, or a combination thereof.

Figure 1A:
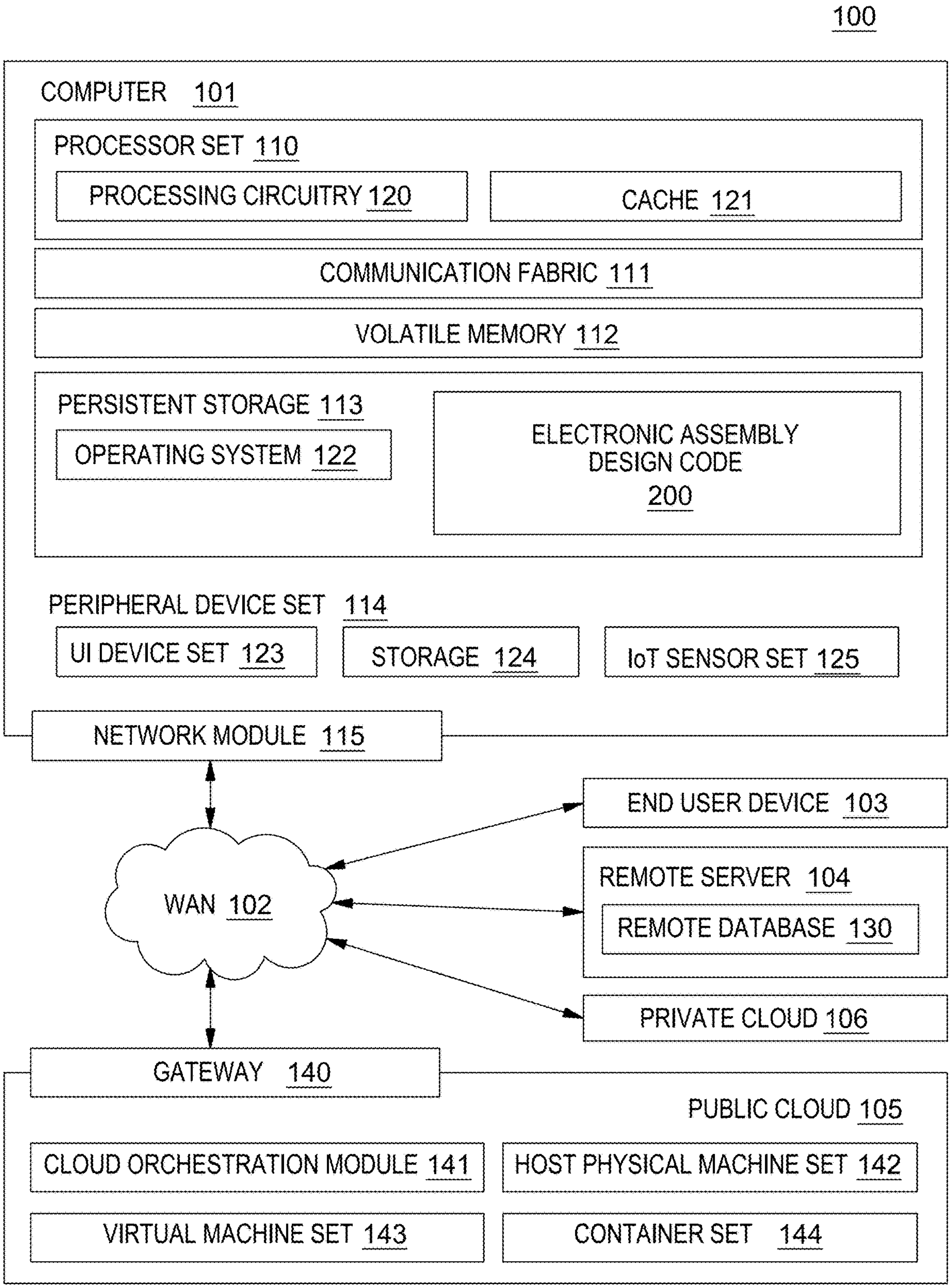
FIG. 1A depicts one example of a computing environment to include and/or use one or more aspects of the present disclosure.

As understood by one skilled in the art, program code, as referred to in this application, can include software and/or hardware. For example, program code in certain embodiments of the present disclosure can utilize a software-based implementation of the functions described, while other embodiments can include fixed function hardware. Certain embodiments combine both types of program code. Examples of program code, also referred to as one or more programs, are depicted in FIG. 1A, including operating system 122 and electronic assembly design code 200, which are stored in persistent storage 113.

One or more aspects of the present disclosure are incorporated in, performed and/or used by a computing environment. As examples, the computing environment can be of various architectures and of various types, including, but not limited to: personal computing, client-server, distributed, virtual, emulated, partitioned, non-partitioned, cloud-based, quantum, grid, time-sharing, clustered, peer-to-peer, mobile, having one node or multiple nodes, having one or more processor sets, each with one processor or multiple processors, and/or any other type of environment and/or configuration, etc., that is capable of executing a process (or multiple processes) that, e.g., perform processing, such as disclosed herein. Aspects of the present disclosure are not limited to a particular architecture or environment.

Various aspects of the present disclosure are described by narrative text, flowcharts, block diagrams of computer systems and/or block diagrams of the machine logic included in computer program product (CPP) embodiments. With respect to any flowcharts, depending upon the technology involved, the operations can be performed in a different order than what is shown in a given flowchart. For example, again depending upon the technology involved, two operations shown in successive flowchart blocks may be performed in reverse order, as a single integrated step, concurrently, or in a manner at least partially overlapping in time.

A computer program product embodiment ("CPP embodiment" or "CPP") is a term used in the present disclosure to describe any set of one, or more, storage media (also called "mediums") collectively included in a set of one, or more, storage devices that collectively include machine readable code corresponding to instructions and/or data for performing computer operations specified in a given CPP claim. A "storage device" is any tangible device that can retain and store instructions for use by a computer processor. Without limitation, the computer readable storage medium may be an electronic storage medium, a magnetic storage medium, an optical storage medium, an electromagnetic storage medium, a semiconductor storage medium, a mechanical storage medium, or any suitable combination of the foregoing. Some known types of storage devices that include these mediums include: diskette, hard disk, random access memory (RAM), read-only memory (ROM), erasable programmable read-only memory (EPROM or Flash memory), static random access memory (SRAM), compact disc read-only memory (CD-ROM), digital versatile disk (DVD), memory stick, floppy disk, mechanically encoded device (such as punch cards or pits/lands formed in a major surface of a disc) or any suitable combination of the foregoing. A computer readable storage medium, as that term is used in the present disclosure, is not to be construed as storage in the form of transitory signals per se, such as radio waves or other freely propagating electromagnetic waves, electromagnetic waves propagating through a waveguide, light pulses passing through a fiber optic cable, electrical signals communicated through a wire, and/or other transmission media. As will be understood by those of skill in the art, data is typically moved at some occasional points in time during normal operations of a storage device, such as during access, de-fragmentation or garbage collection, but this does not render the storage device as transitory because the data is not transitory while it is stored.

As illustrated in FIG. 1A, computing environment 100 contains an example of an environment for the execution of at least some of the computer code involved in performing the inventive methods, such as electronic assembly design code 200. In addition to code 200, computing environment 100 includes, for example, computer 101, wide area network (WAN) 102, end user device (EUD) 103, remote server 104, public cloud 105, and private cloud 106. In this embodiment, computer 101 includes processor set 110 (including processing circuitry 120 and cache 121), communication fabric 111, volatile memory 112, persistent storage 113 (including operating system 122 and code 200, as identified above), peripheral device set 114 (including user interface (UI) device set 123, storage 124, and Internet of Things (IoT) sensor set 125), and network module 115. Remote server 104 includes remote database 130. Public cloud 105 includes gateway 140, cloud orchestration module 141, host physical machine set 142, virtual machine set 143, and container set 144.

Computer 101 may take the form of a desktop computer, laptop computer, tablet computer, smart phone, smart watch or other wearable computer, mainframe computer, quantum computer or any other form of computer or mobile device now known or to be developed in the future that is capable of running a program, accessing a network or querying a database, such as remote database 130. As is well understood in the art of computer technology, and depending upon the technology, performance of a computer-implemented method may be distributed among multiple computers and/or between multiple locations. On the other hand, in this presentation of computing environment 100, detailed discussion is focused on a single computer, specifically computer 101, to keep the presentation as simple as possible. Computer 101 may be located in a cloud, even though it is not shown in a cloud in FIG. 1A. On the other hand, computer 101 is not required to be in a cloud except to any extent as may be affirmatively indicated.

Processor set 110 includes one, or more, computer processors of any type now known or to be developed in the future. Processing circuitry 120 may be distributed over multiple packages, for example, multiple, coordinated integrated circuit chips. Processing circuitry 120 may implement multiple processor threads and/or multiple processor cores. Cache 121 is memory that is located in the processor chip package(s) and is typically used for data or code that should be available for rapid access by the threads or cores running on processor set 110. Cache memories are typically organized into multiple levels depending upon relative proximity to the processing circuitry. Alternatively, some, or all, of the cache for the processor set may be located "off chip." In some computing environments, processor set 110 may be designed for working with qubits and performing quantum computing.

Computer readable program instructions are typically loaded onto computer 101 to cause a series of operational steps to be performed by processor set 110 of computer 101 and thereby effect a computer-implemented method, such that the instructions thus executed will instantiate the methods specified in flowcharts and/or narrative descriptions of computer-implemented methods included in this document (collectively referred to as "the inventive methods"). These computer readable program instructions are stored in various types of computer readable storage media, such as cache 121 and the other storage media discussed below. The program instructions, and associated data, are accessed by processor set 110 to control and direct performance of the inventive methods. In computing environment 100, at least some of the instructions for performing the inventive methods may be stored in code 200 in persistent storage 113.

Communication fabric 111 is the signal conduction path that allows the various components of computer 101 to communicate with each other. Typically, this fabric is made of switches and electrically conductive paths, such as the switches and electrically conductive paths that make up buses, bridges, physical input/output ports and the like. Other types of signal communication paths may be used, such as fiber optic communication paths and/or wireless communication paths.

Volatile memory 112 is any type of volatile memory now known or to be developed in the future. Examples include dynamic type random access memory (RAM) or static type RAM. Typically, volatile memory 112 is characterized by random access, but this is not required unless affirmatively indicated. In computer 101, the volatile memory 112 is located in a single package and is internal to computer 101, but, alternatively or additionally, the volatile memory may be distributed over multiple packages and/or located externally with respect to computer 101.

Persistent storage 113 is any form of non-volatile storage for computers that is now known or to be developed in the future. The non-volatility of this storage means that the stored data is maintained regardless of whether power is being supplied to computer 101 and/or directly to persistent storage 113. Persistent storage 113 may be a read only memory (ROM), but typically at least a portion of the persistent storage allows writing of data, deletion of data and re-writing of data. Some familiar forms of persistent storage include magnetic disks and solid state storage devices. Operating system 122 may take several forms, such as various known proprietary operating systems or open source Portable Operating System Interface type operating systems that employ a kernel. The code included in data-analytics-based electronic assembly design code 200 includes at least some of the computer code involved in performing the inventive methods.

Peripheral device set 114 includes the set of peripheral devices of computer 101. Data communication connections between the peripheral devices and the other components of computer 101 may be implemented in various ways, such as Bluetooth connections, Near-Field Communication (NFC) connections, connections made by cables (such as universal serial bus (USB) type cables), insertion type connections (for example, secure digital (SD) card), connections made through local area communication networks and even connections made through wide area networks such as the internet. In various embodiments, UI device set 123 may include components such as a display screen, speaker, microphone, wearable devices (such as goggles and smart watches), keyboard, mouse, printer, touchpad, game controllers, and haptic devices. Storage 124 is external storage, such as an external hard drive, or insertable storage, such as an SD card. Storage 124 may be persistent and/or volatile. In some embodiments, storage 124 may take the form of a quantum computing storage device for storing data in the form of qubits. In embodiments where computer 101 is required to have a large amount of storage (for example, where computer 101 locally stores and manages a large database) then this storage may be provided by peripheral storage devices designed for storing very large amounts of data, such as a storage area network (SAN) that is shared by multiple, geographically distributed computers. IoT sensor set 125 is made up of sensors that can be used in Internet of Things applications. For example, one sensor may be a thermometer and another sensor may be a motion detector.

Network module 115 is the collection of computer software, hardware, and firmware that allows computer 101 to communicate with other computers through WAN 102. Network module 115 may include hardware, such as modems or Wi-Fi signal transceivers, software for packetizing and/or de-packetizing data for communication network transmission, and/or web browser software for communicating data over the internet. In some embodiments, network control functions and network forwarding functions of network module 115 are performed on the same physical hardware device. In other embodiments (for example, embodiments that utilize software-defined networking (SDN)), the control functions and the forwarding functions of network module 115 are performed on physically separate devices, such that the control functions manage several different network hardware devices. Computer readable program instructions for performing the inventive methods can typically be downloaded to computer 101 from an external computer or external storage device through a network adapter card or network interface included in network module 115.

WAN 102 is any wide area network (for example, the internet) capable of communicating computer data over non-local distances by any technology for communicating computer data, now known or to be developed in the future. In some embodiments, the WAN 102 may be replaced and/or supplemented by local area networks (LANs) designed to communicate data between devices located in a local area, such as a Wi-Fi network. The WAN and/or LANs typically include computer hardware such as copper transmission cables, optical transmission fibers, wireless transmission, routers, firewalls, switches, gateway computers and edge servers.

End User Device (EUD) 103 is any computer system that is used and controlled by an end user (for example, a customer of an enterprise that operates computer 101) and may take any of the forms discussed above in connection with computer 101. EUD 103 typically receives helpful and useful data from the operations of computer 101. For example, in a hypothetical case where computer 101 is designed to provide a recommendation to an end user, this recommendation would typically be communicated from network module 115 of computer 101 through WAN 102 to EUD 103. In this way, EUD 103 can display, or otherwise present, the recommendation to an end user. In some embodiments, EUD 103 may be a client device, such as thin client, heavy client, mainframe computer, desktop computer and so on.

Remote server 104 is any computer system that serves at least some data and/or functionality to computer 101. Remote server 104 may be controlled and used by the same entity that operates computer 101. Remote server 104 represents the machine(s) that collect and store helpful and useful data for use by other computers, such as computer 101. For example, in a hypothetical case where computer 101 is designed and programmed to provide a recommendation based on historical data, then this historical data may be provided to computer 101 from remote database 130 of remote server 104.

Public cloud 105 is any computer system available for use by multiple entities that provides on-demand availability of computer system resources and/or other computer capabilities, especially data storage (cloud storage) and computing power, without direct active management by the user. Cloud computing typically leverages sharing of resources to achieve coherence and economies of scale. The direct and active management of the computing resources of public cloud 105 is performed by the computer hardware and/or software of cloud orchestration module 141. The computing resources provided by public cloud 105 are typically implemented by virtual computing environments that run on various computers making up the computers of host physical machine set 142, which is the universe of physical computers in and/or available to public cloud 105. The virtual computing environments (VCEs) typically take the form of virtual machines from virtual machine set 143 and/or containers from container set 144. It is understood that these VCEs may be stored as images and may be transferred among and between the various physical machine hosts, either as images or after instantiation of the VCE. Cloud orchestration module 141 manages the transfer and storage of images, deploys new instantiations of VCEs and manages active instantiations of VCE deployments. Gateway 140 is the collection of computer software, hardware, and firmware that allows public cloud 105 to communicate through WAN 102.

Some further explanation of virtualized computing environments (VCEs) will now be provided. VCEs can be stored as "images." A new active instance of the VCE can be instantiated from the image. Two familiar types of VCEs are virtual machines and containers. A container is a VCE that uses operating-system-level virtualization. This refers to an operating system feature in which the kernel allows the existence of multiple isolated user-space instances, called containers. These isolated user-space instances typically behave as real computers from the point of view of programs running in them. A computer program running on an ordinary operating system can utilize all resources of that computer, such as connected devices, files and folders, network shares, CPU power, and quantifiable hardware capabilities. However, programs running inside a container can only use the contents of the container and devices assigned to the container, a feature which is known as containerization.

Private cloud 106 is similar to public cloud 105, except that the computing resources are only available for use by a single enterprise. While private cloud 106 is depicted as being in communication with WAN 102, in other embodiments a private cloud may be disconnected from the internet entirely and only accessible through a local/private network. A hybrid cloud is a composition of multiple clouds of different types (for example, private, community or public cloud types), often respectively implemented by different vendors. Each of the multiple clouds remains a separate and discrete entity, but the larger hybrid cloud architecture is bound together by standardized or proprietary technology that enables orchestration, management, and/or data/application portability between the multiple constituent clouds. In this embodiment, public cloud 105 and private cloud 106 are both part of a larger hybrid cloud.

Cloud computing services and/or microservices (not separately shown in FIG. 1A): private and public clouds 106 are programmed and configured to deliver cloud computing services and/or microservices (unless otherwise indicated, the word "microservices" shall be interpreted as inclusive of larger "services" regardless of size). Cloud services are infrastructure, platforms, or software that are typically hosted by third-party providers and made available to users through the internet. Cloud services facilitate the flow of user data from front-end clients (for example, user-side servers, tablets, desktops, laptops), through the internet, to the provider's systems, and back. In some embodiments, cloud services may be configured and orchestrated according to an "as a service" technology paradigm where something is being presented to an internal or external customer in the form of a cloud computing service. As-a-Service offerings typically provide endpoints with which various customers interface. These endpoints are typically based on a set of APIs. One category of as-a-service offering is Platform as a Service (PaaS), where a service provider provisions, instantiates, runs, and manages a modular bundle of code that customers can use to instantiate a computing platform and one or more applications, without the complexity of building and maintaining the infrastructure typically associated with these things. Another category is Software as a Service (SaaS) where software is centrally hosted and allocated on a subscription basis. SaaS is also known as on-demand software, web-based software, or web-hosted software. Four technological sub-fields involved in cloud services are: deployment, integration, on demand, and virtual private networks.

The computing environment described above is only one example of a computing environment to incorporate, perform and/or use one or more aspects of the present disclosure. Other examples are possible. Further, in one or more embodiments, one or more of the components/modules of FIG. 1A need not be included in the computing environment and/or are not used for one or more aspects of the present disclosure. Further, in one or more embodiments, additional and/or other components/modules can be used. Other variations are possible.

Figure 1B:
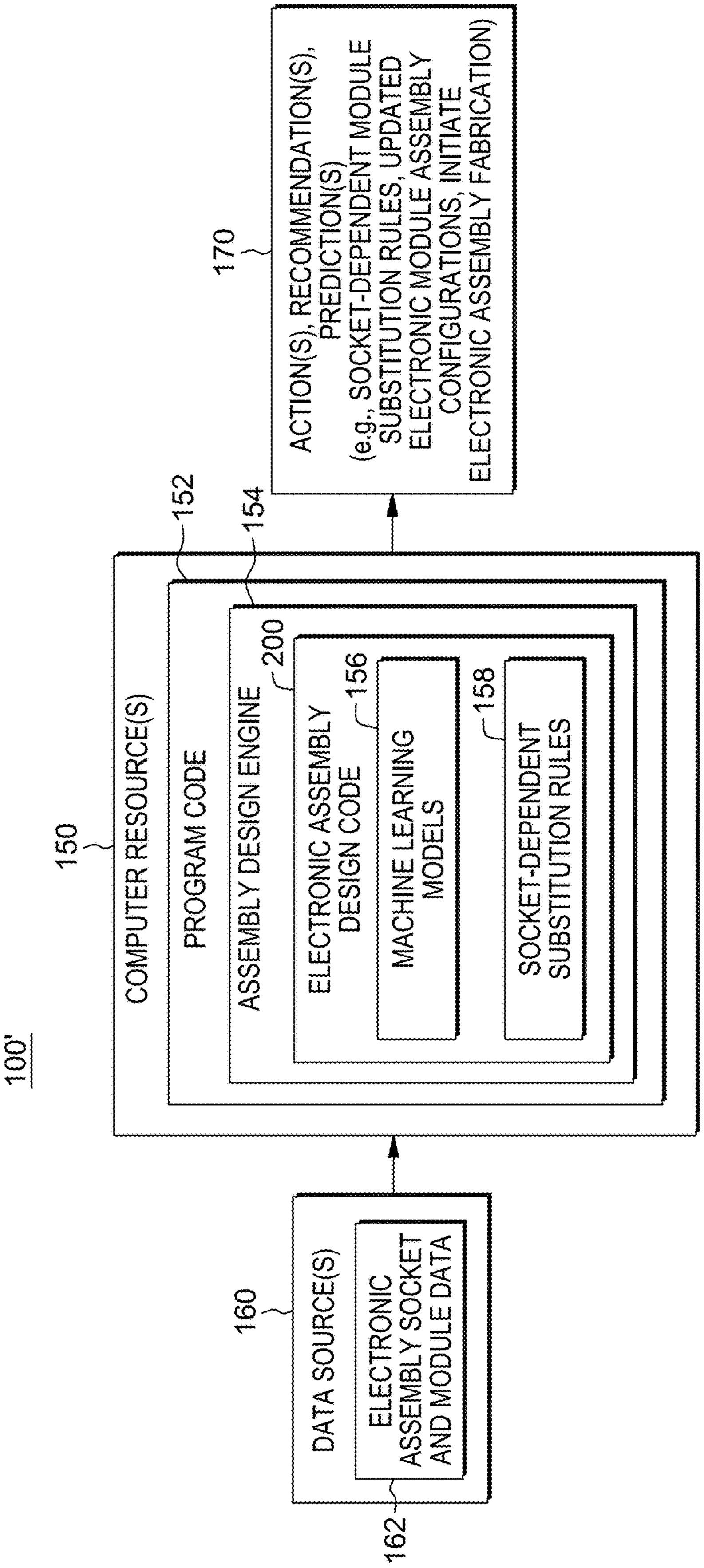
FIG. 1B depicts another example of a computing environment to include and/or use one or more aspects of the present disclosure.

By way of further example, FIG. 1B depicts another embodiment of a computing environment 100', which can incorporate, use or implement, one or more aspects of an embodiment of the present disclosure. In one or more embodiments, computing environment 100' is implemented as part of, or includes, a computing environment such as computing environment 100 described above in connection with FIG. 1A. Computing environment 100' contains one or more computer resources 150, such as one or more computers 101 of FIG. 1A, connected to receive (e.g., obtain, access, etc.) data from one or more data sources 160, such as electronic assembly socket data and module data 162. For instance, the data source(s) includes one or more databases containing electronic assembly design data including socket data, such as socket location and socket type, as well as electronic module data, such as data indicative of a plurality of electronic module types which are available for plugging into respective sockets of a particular power-constrained electronic assembly design.

In embodiments, the one or more computer resources 150 execute program code 152 that runs or implements, for instance, an assembly design engine 154 (or agent or tool) that executes or includes one or more aspects of electronic assembly design code 200, such as disclosed herein. In one or more embodiments, electronic assembly design code 200 includes, or utilizes, one or more machine learning models 156, which can be part of electronic assembly design code 200 or accessed by electronic assembly design code 200. Electronic assembly design code 200 facilitates data analytics-based processing associated with obtaining, by the assembly design engine, socket-dependent substitution rules 158 indicating where a different electronic module type of a plurality of electronic module types can be used in place of another electronic module type at a particular socket in an electronic module assembly configuration absent violating a power constraint of a respective power-constrained electronic assembly design. The electronic assembly design includes multiple electronic module sockets to accommodate multiple electronic modules of the electronic module assembly configuration. In one particular embodiment described herein, the electronic assembly design includes four processor modules receiving sockets, with each processor module being, for instance, a respective multicore processor module.

In embodiments, the socket-dependent substitution rules 158 are obtained by the assembly design engine. In one embodiment, the socket-dependent substitution rules are generated by the assembly design engine executing the electronic assembly design code 200, such as described herein. In embodiments, electronic assembly design code 200 of the assembly design engine automatically generates an updated electronic module assembly configuration for the electronic assembly design using at least one substitution rule of the socket-dependent substitution rules, where one electronic module type of the electronic modules assembly configuration is replaced at the particular socket of the multiple sockets with a different electronic module type of the plurality of electronic module types. In embodiments, one or more aspects of assembly design engine 154, such as electronic assembly design code 200, can utilize one or more trained machine learning models 156 such as, for instance, in obtaining the socket-dependent substitution rules, and/or in automatically generating the updated electronic module assembly configuration using at least one substitution rule of the socket-dependent substitution rules.

In one or more embodiments, electronic assembly design code 200, and/or assembly design engine 154, further initiates fabrication of an electronic assembly using the updated electronic module assembly configuration. For instance, in one or more embodiments, electronic assembly design code 200, and/or assembly design engine 154, provides one or more actions, recommendations or predictions 170 to, for instance, facilitate automated electronic assembly design/production, as described herein. In one or more aspects, the actions, recommendations and/or predictions can be, or include, the generated socket-dependent substitution rules, the updated electronic module assembly configuration(s), an action to initiate electronic assembly fabrication, etc., in accordance with the present disclosure. In one example, fabrication can be initiated by automatically sending, for instance, an indication to commence a fabrication process for a particular electronic module type needed in the electronic assembly design, and/or to initiate fabrication of the electronic assembly based on the updated electronic module assembly configuration. As an example, the indication is sent by a computer (e.g., computer 101 of FIG. 1A), a processor of a processor set (e.g., processer set 110 (FIG. 1A)) and/or processing circuitry of a processor set (e.g., processor set 110) (FIG. 1A) to a computing or electronic component that receives the indication and automatically initiates the action. Alternatively, or additionally, the one or more indications can be sent to a fabrication system that performs the action. Based on initiating electronic assembly fabrication, the fabrication is performed. Many possibilities exist.

In one or more implementations, computing environment 100' can include, or utilize, one or more networks for interfacing various aspects of computing resource(s) 150, data source(s) 160, as well as one of or more other controllers, components, systems, etc., receiving a result, action, instruction, etc. 170 of the electronic assembly design code 200, and/or assembly design engine 154, in a manner that facilitates processing of data within the computing environment, including the design and production of one or more power-constrained electronic assembly designs, such as disclosed herein. By way of example, the network(s) can be, for instance, a telecommunications network, a local area network (LAN), a wide area network (WAN), such as the Internet, or a combination thereof, and can include wired, wireless, fiber optic connections, etc. The network(s) can include one or more wired and/or wireless networks that are capable of receiving and transmitting data, including (for instance) training data for one or more artificial intelligence (AI) agents of the electronic assembly design code, or the assembly design engine, and an output solution, recommendation, action of the electronic assembly design code, and/or assembly design engine such discussed herein.

In one or more implementations, computer resource(s) 150 house and/or execute program code 152 configured to perform computer-implemented methods in accordance with one or more aspects of the present disclosure. By way of example, computer resource(s) 150 can be a computing-system-implemented resource(s). Further, for illustrative purposes only, computing resource(s) 150 in FIG. 1B is depicted as being a single computer resource. This is a non-limiting example of an implementation. In one or more other embodiments, computer resource(s) 150, which implements one or more aspects of processing such as discussed herein, can, at least in part, be implemented in multiple separate computer resources or systems, such as one or more computer resources of a cloud-hosting environment, by way of example.

Briefly described, in one embodiment, computer resource(s) 150 can include one or more processor sets with one or more processors, for instance, central processing units (CPUs). Also, the processor set(s) can include functional components used in the integration of program code, such as functional components to fetch program code from locations in memory, such as cache or main memory, decode program code, and execute program code, access memory for instruction execution, and write results of the executed instructions or code. The processor set(s) can also include a register(s) to be used by one or more of the functional components. In one or more embodiments, the computing resource(s) can include memory, input/output, a network interface, and storage, which can include and/or access, one or more other computing resources and/or databases, as required to implement the electronic assembly design code processing described herein. The components of the respective computing resource(s) can be coupled to each other via one or more buses and/or other connections. Bus connections can be one or more of any of several types of bus structures, including a memory bus or a memory controller, a peripheral bus, an accelerated graphics port, and a processor or local bus, using any of a variety of architectures. By way of example, but not limitation, such architectures can include the Industry Standard Architecture (ISA), the micro-channel architecture (MCA), the enhanced ISA (EISA), the Video Electronic Standard Association (VESA), local bus, and peripheral component interconnect (PCI). As noted, examples of a computer resource(s), or computing system(s) or controller(s), which can implement one or more aspects disclosed are described further herein.

In one or more embodiments, program code 152 includes, executes, accesses, etc., one or more artificial intelligence agents, such as assembly design engine (or agent or tool) 154, which can train and/or use one or more machine learning models 156 that embody (in part), or are used by, the electronic assembly design code 200. The artificial intelligence agent(s) can be (in part) an existing artificial intelligence (AI) agent or existing AI tool and/or can include, or use, one or more machine learning models that can be pretrained using training data that can include a variety of types of electronic assembly socket data and module data, as well as a variety of power-constrained electronic assembly designs. In one or more embodiments, program code 152 executing on one or more computer resources 150 applies one or more algorithms of, for instance, the artificial intelligence agent(s) to generate and train the machine learning model(s) 156, which the program code then utilizes to, for instance, implement one or more aspects of electronic assembly design code 200. In an initialization or learning stage, program code 152 can train the one or more machine learning models using obtained training data to implement, for instance, one or more aspects of the code, functions, modules and/or tools described herein.

Data used to train the models, in one or more embodiments, can include a variety of types of electronic assembly data, such as the power-constrained electronic assembly design data described herein, including particular electronic socket data, as well as electronic module type data, such as multiprocessor module type data, as in the examples described herein. Program code, in embodiments of the present disclosure, can perform data analysis to generate data structures, including algorithms utilized by the program code to implement one or more aspects of the electronic assembly design code and/or initiate (or perform) an action related thereto. As known, machine learning-based modeling solves problems that cannot be solved by numerical means alone. In one example, program code extracts features/attributes from the training data, which can be stored in memory or one or more databases. The extracted features can be utilized to develop a predictor function, h(x), also referred to as a hypothesis, which the program code utilizes as a model. In identifying machine learning model(s), various techniques can be used to select features (elements, patterns, attributes, etc.), including but not limited to, diffusion mapping, principal component analysis, recursive feature elimination (a brute force approach to selecting features), and/or a random forest, to select the attributes related to the particular model. Program code can utilize one or more algorithms to train the model(s) (e.g., the algorithms utilized by program code), including providing weights for conclusions, so that the program code can train any predictor or performance functions included in the model. The conclusions can be evaluated by a quality metric. By selecting a diverse set of training data, the program code trains the model to identify and weigh various attributes (e.g., features, patterns) that correlate to enhanced performance of the model.

In one or more embodiments, program code, executing on one or more processors, utilizes one or more artificial intelligence agents (now known or later developed) to facilitate implementing one or more aspects disclosed herein. In one or more embodiments, the program code can interface with application programming interfaces to perform a cognitive analysis of obtained and/or converted data. Specifically, in one or more embodiments, certain application programing interfaces include a cognitive agent (e.g., learning agent) that includes one or more programs, including, but not limited to, natural language classifiers, a retrieve-and-rank service that can surface the most relevant information, concepts/visual insights, tradeoff analytics, document conversion, and/or relationship extraction. In an embodiment, one or more programs analyze the data obtained by the program code from one or more sources utilizing one or more of a natural language classifier, retrieve-and-rank application programming interfaces, and tradeoff analytics application programing interfaces, etc.

In one or more embodiments, the program code can utilize one or more neural networks (NNs) to analyze training data and/or collected data to generate an operational machine learning model. Neural networks are a programming paradigm which enable a computer to learn from observational data. This learning is referred to as deep learning, which is a set of techniques for learning in neural networks. Neural networks, including modular neural networks, are capable of pattern (e.g., state) recognition with speed, accuracy, and efficiency, in situations where datasets are mutual and expansive, including across a distributed network, including but not limited to, cloud computing systems. Modern neural networks are non-linear statistical data modeling tools. They are usually used to model complex relationships between inputs and outputs, or to identify patterns (e.g., states) in data (i.e., neural networks are non-linear statistical data modeling or decision-making tools). In general, program code utilizing neural networks can model complex relationships between inputs and outputs and identified patterns in data. Because of the speed and efficiency of neural networks, especially when parsing multiple complex datasets, neural networks and deep learning provide solutions to many problems in multi-source processing, which program code, in embodiments of the present disclosure, can utilize in implementing a machine learning model, such as described herein.

Figure 2A:
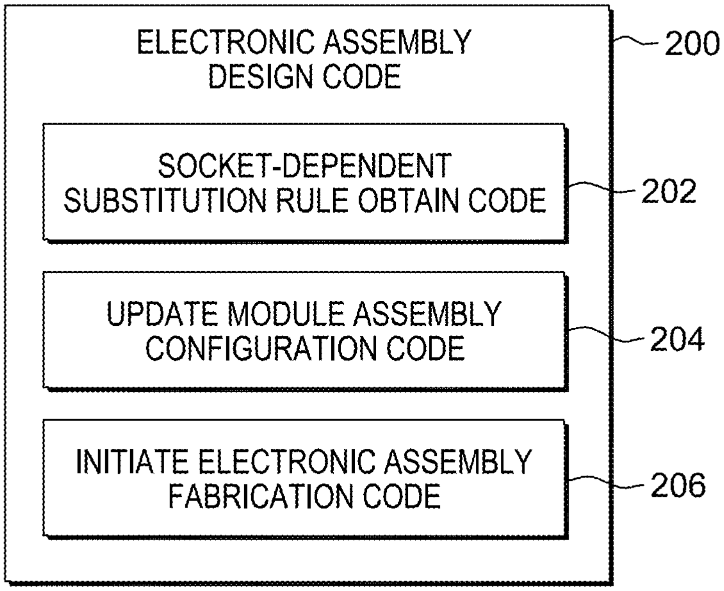
FIGS. 2A-2B depict one embodiment of a computer program product with electronic assembly design code, in accordance with one or more aspects of the present disclosure.
Figure 2B:
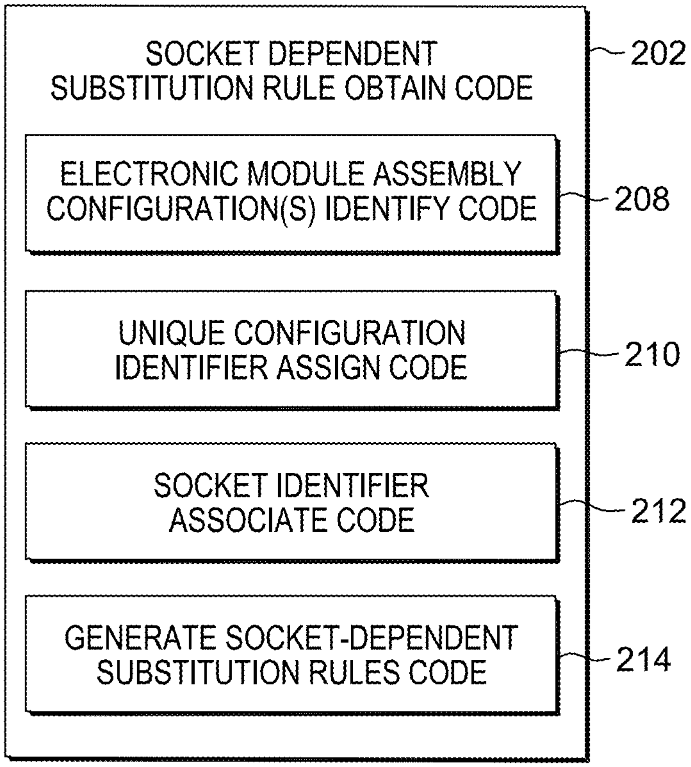
Figure 3:
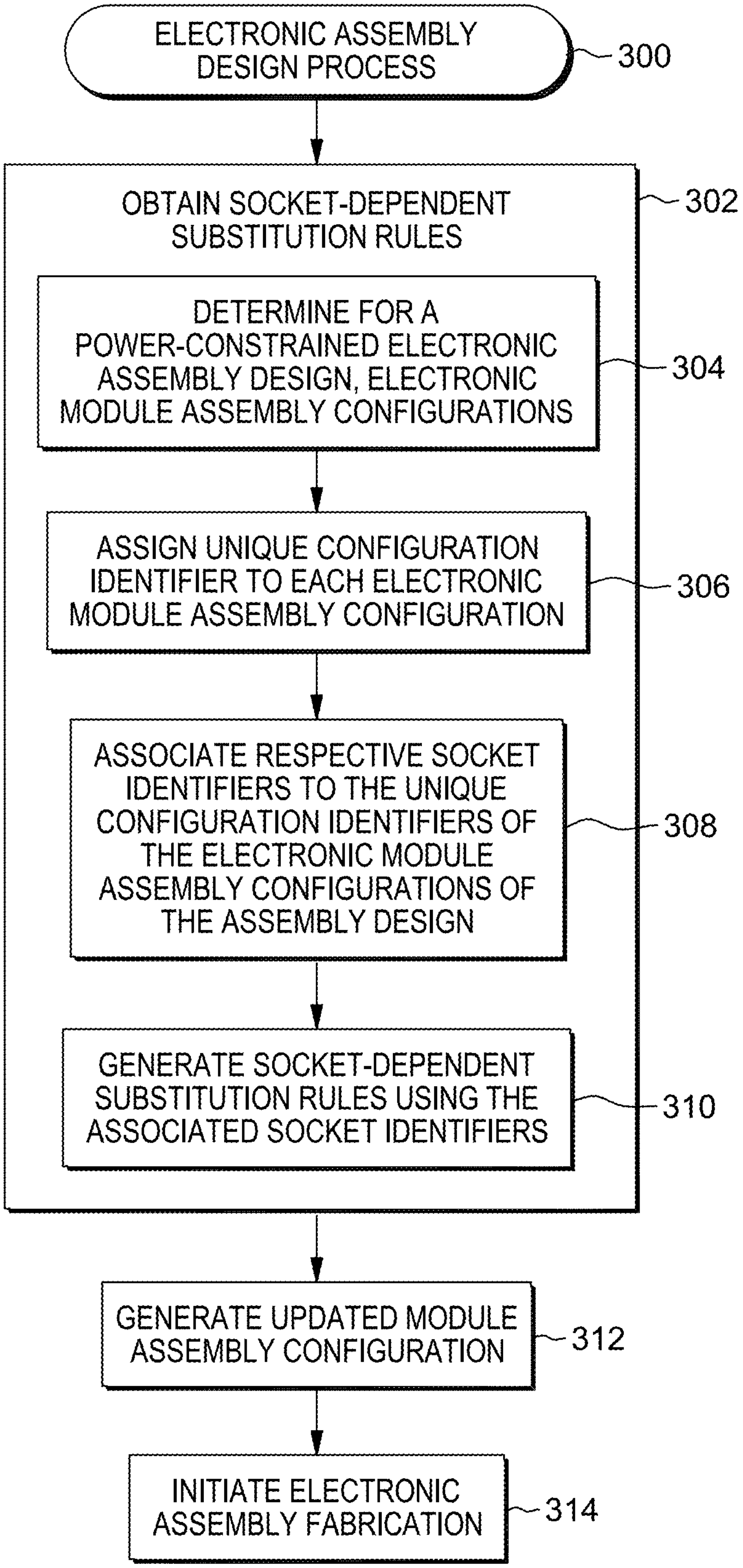
FIG. 3 depicts one embodiment of an electronic assembly design process, in accordance with one or more aspects of the present disclosure.

By way of example, one or more embodiments of an electronic assembly design code and workflow are described initially with reference to FIGS. 2A-3. FIGS. 2A-2B depicts one embodiment of electronic assembly design code 200 that includes code or instructions to perform electronic assembly design, in accordance with one or more aspects of the present disclosure, and FIG. 3 depicts one embodiment of an electronic assembly design process, in accordance with one or more aspects of the present disclosure.

Referring to FIGS. 1A-2B, electronic assembly design code 200 includes, in one example, various code or submodules used to perform processing, in accordance with one or more aspects of the present disclosure. The sub-modules are, e.g., computer-readable program code (e.g., instructions) in computer-readable media (e.g., persistent storage (e.g., persistent storage 113, such as a disk) and/or a cache (e.g., cache 121), as examples). The computer-readable media can be part of a computer program product and can be executed by and/or using one or more computers, such as computer(s) 101 (FIG. 1A) and/or computer resource(s) 150 (FIG. 1B); one or more processor sets 110 (FIG. 1A); processors, such as one or more processors of processor set 110; and/or processing circuitry, such as processing circuity of processor set 110, etc.

As noted, FIGS. 2A-2B depict one embodiment of electronic assembly design code 200 which, in one or more implementations, includes, or facilitates, electronic assembly design processing in accordance with one or more aspects of the present disclosure. In the embodiment of FIGS. 2A-2B, example code of electronic assembly design code 200 includes socket-dependent substitution rule obtain code 202 to obtain socket-dependent substitution rules indicating where a different electronic module type of a plurality of electronic module types can be used in place of another electronic module type for a particular socket in an electronic module assembly configuration absent violating a power constraint of the respective power-constrained electronic assembly design. As noted, the electronic assembly design includes multiple electronic module sockets to accommodate multiple electronic modules of the particular electronic module assembly configuration.

As shown in FIG. 2B, in one or more embodiments, socket-dependent substitution rule obtain code 202 includes electronic module assembly configuration(s) identify code 208 to determine or identify one or more electronic module assembly configurations for the particular power-constrained electronic assembly design. For instance, in one embodiment, the electronic module assembly configuration(s) identify code 208 identifies all possible electronic module assembly configurations for the particular power-constrained electronic assembly design using the plurality of different electronic module types, and number and type of sockets in the assembly design. Further, in one or more embodiments, socket-dependent substitution rule obtain code 202 includes unique configuration identifier assign code 210 to assign a unique configuration identifier to each electronic module assembly configuration of the power-constrained electronic assembly design. In embodiments, socket-dependent substitution rule obtain code 202 further includes socket identifier associate code 212 to associate, using the unique configuration identifiers, respective socket identifiers of the multiple electronic module sockets of the electronic assembly design to the one or more electronic module assembly configurations of the design. In embodiments, socket-dependent substitution rule obtain code 202 further includes generate socket-dependent substitution rules code 214 to generate the socket-dependent substitution rules using the power constraint, the socket identifiers and the unique configuration identifiers, such as disclosed herein.

As illustrated in FIG. 2A, in one or more embodiments, electronic assembly design code 200 further includes updated module assembly configuration obtain code 204 to automatically generate an updated electronic module assembly configuration for the electronic assembly design using at least one substitution rule of the socket-dependent substitution rules, where at least one electronic module type of the electronic module assembly configuration is replaced at one or more sockets of the multiple sockets with a different electronic module type of the plurality of electronic module types. In embodiments, electronic assembly design code 200 further includes initiate electronic assembly fabrication code 206 to initiate fabricating of an electronic assembly using the updated electronic module assembly configuration of the electronic assembly design.

Note also that although various code or sub-modules are described herein, an electronic assembly design code, such as disclosed, can use, or include, additional, fewer, and/or different code/sub-modules. A particular code can include additional code, including code of other sub-modules, or less code. Further, additional and/or fewer code/sub-modules can be used. Many variations are possible.

In one or more embodiments, the electronic assembly design code is used, in accordance with one or more aspects of the present disclosure, to perform electronic assembly design processing. FIG. 3 depicts one example of an electronic assembly design process 300, such as disclosed herein. The process is executed, in one or more embodiments, by a computer (e.g., computer 101 (FIG. 1A), computer resource(s) 150 (FIG. 1B)), and/or one or more processor sets, such as a processor or processing circuitry (e.g., of processor set 110 of FIG. 1A). In one example, code or instructions implementing the process, are part of a code or module, such as electronic assembly design code 200 of FIGS. 1A-2B. In other examples, the code can be included in one or more other modules and/or one or more other sub-modules of one or more other modules. Various options are available.

As illustrated in FIG. 3, in one example, electronic assembly design process 300 executing on one or more computers (e.g., computer 101 of FIG. 1A), one or more processor sets (e.g., processor set 110 of FIG. 1A, such as a processor or processing circuitry of the processor set) performs electronic assembly design processing such as described herein, which includes, in one or more embodiments, obtaining socket-dependent substitution rules 302 indicating where a different electronic module type of a plurality of electronic module types can be used in place of another electronic module type at a particular socket in an electronic module assembly configuration absent violating a power constraint of the respective power-constrained electronic assembly design. In embodiments, the electronic assembly design includes multiple electronic module sockets to accommodate multiple electronic modules of the electronic module assembly configuration.

In one or more embodiments, obtaining socket-dependent substitution rules 302 includes determining for a power-constrained electronic assembly design one or more electronic module assembly configurations 304. For instance, in one or more embodiments, all electronic assembly configurations for the particular power-constrained electronic assembly design are determined or identified using the power constraint, number of sockets and the plurality of different electronic module types. In addition, obtaining socket-dependent substitution rules includes, in one or more embodiments, assigning a unique configuration identifier to each electronic module assembly configuration determined 306, and further associating respective socket identifiers with the unique configuration identifiers of the electronic module assembly configurations of the assembly design 308. The respective socket identifiers and unique configuration identifiers are then used, in one or more embodiments, to generate socket-dependent substitution rules 310. In embodiments, the socket-dependent substitution rules include, for the electronic design assembly, one set of substitution rules for one electronic module socket of the multiple electronic module sockets, and another set of substitution rules for another electronic module socket of the multiple electronic module sockets of the electronic assembly design. Further, in one or more embodiments, generating the socket-dependent substitution rules includes generating multiple design engine substitution rules for each socket of the multiple sockets of the particular power-constrained electronic assembly design using the socket identifiers of the multiple electronic module sockets and the unique configuration identifiers of the one or more electronic module assembly configurations.

In embodiments, electronic assembly design process 300 further includes generating, for instance, by the assembly design engine, an updated electronic module assembly configuration for the electronic assembly design using at least one substitution rule of the socket-dependent substitution rules, where one electronic module type of the electronic module assembly configuration is replaced at the particular socket of the multiple sockets with a different electronic module type of the plurality of the electronic module types 312. Further, in one or more embodiments, electronic assembly design process 300 further includes initiating fabrication of an electronic assembly using the updated electronic module assembly configuration of the electronic assembly design 314. In one example, an action is initiated by automatically sending, for instance, an indication to commence fabrication of one or more electronic module types and/or the particular power-constrained electronic assembly of the electronic assembly design using the updated configuration. As an example, the indication is sent by a computer (e.g., computer 101 (FIG. 1A)), a processor of a processor set (e.g., processor set 110 (FIG. 1A)), and/or processing circuitry of a processor set (e.g., processor set 110) (FIG. 1A) or computer resource(s) 150 running assembly design engine 154 implementing electronic assembly design code 200 to a compute system, electronic component, etc. of a fabrication system, that receives the indication and automatically initiates the action.

Figure 4:
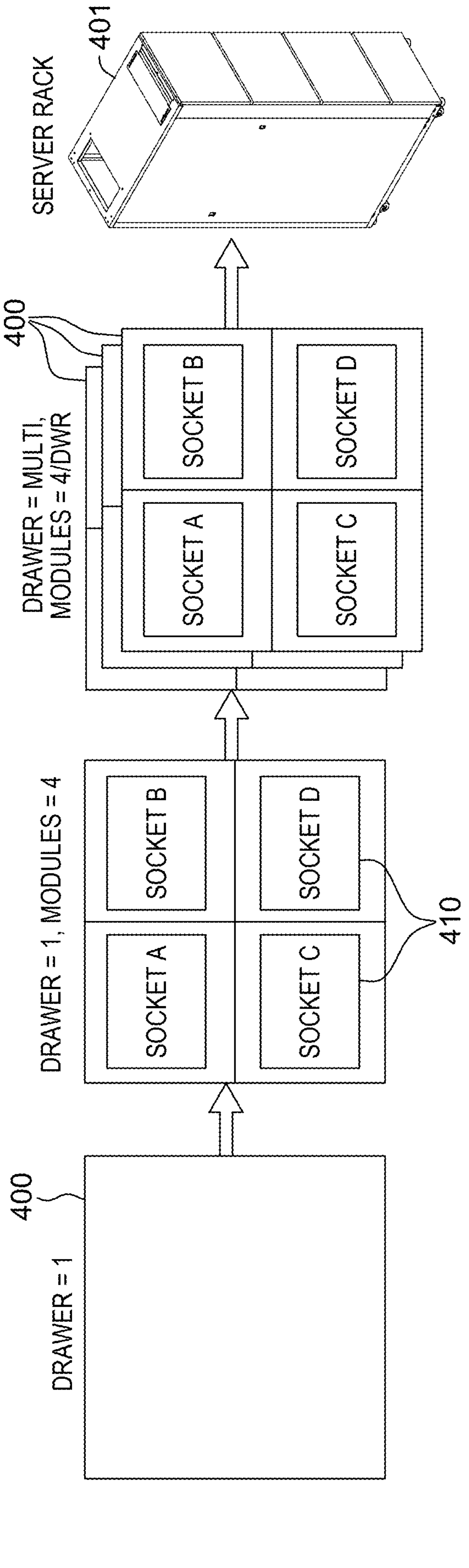
FIG. 4 is a further example of a computing environment with one or more power-constrained electronic assemblies to be designed and fabricated, in accordance with one or more aspects of the present disclosure.

By way of example, FIGS. 4-6D illustrate implementation and use of electronic assembly design code and processing, such as disclosed herein. As illustrated in FIG. 4, in one embodiment, the electronic assembly to be fabricated can be a drawer 400 of an information technology (IT) server rack 401. In implementation, server rack 401 can include one or more electronic assemblies or drawers 400. In the embodiment illustrated, one drawer includes four sockets A, B, C, D 410 for receiving four electronic modules (not shown). Sockets 410 can be the same or different types of sockets for receiving the same or different types of electronic modules, depending upon the electronic assembly design. As shown, multiple drawers 400 can be included within server rack 401, in one embodiment.

By way of specific example, one or more drawers such as discussed herein can be built using electronic modules of various types, that can only be plugged in to certain socket locations within the drawer, with four socket locations being illustrated in FIG. 4, by way of example only. In one or more embodiments, multiple drawer offerings can be provided by an IT rack manufacturer, with each drawer offering having an associated assembly design number, or part number, referred to herein as lv 90. The unique drawer offerings have different power constraints, and combined with the different configurations possible using different electronic modules (such as discussed herein), the number of resultant potential combinations of modules to sockets can be in the order of tens of thousands unique drawer combinations that could potentially be designed for fabrication by a manufacturer.

In implementation, the electronic module assembly configurations define sets of rules through which a given drawer can be fabricated. These configurations determine the permissible combinations of the modules and sockets for each electronic assembly type (e.g., drawer type). For instance, with electronic module types such as described herein, a 57H, 57M & 57L assembly design might have 3, 1, 1 way of building them, respectively, where ‘H’ denotes high power, ‘M’ medium power and ‘L’ low power. In this example, 57 refers to 57 processor cores, which are the total number of processor cores across the four multi-processor electronic modules to be plugged into the respective sockets of the electronic assembly. These different ways of laying out the drawer, described as combinations of electronic modules and their sockets, can be used to complement each other in order to build multiple valid (i.e., within defined constraints) drawers. The set of constraints (such as power constraints) are called plug plans or plug rules. In implementation, the configurations designed are to be followed to avoid violating an associated power constraint. As noted, after accounting for permutations and combinations, there can be thousands of unique drawer enumerations that could be built using available modules given a particular plug plan. In order for a design engine (or agent) to plan and recommend an optimal supply solution, the engine needs to comprehend all the unique enumerations. One way for the design engine to comprehend the enumerations is for a user to, one by one, input all the possible combinations into the engine. This is not a practical implementation as it would take too long for the user to input, and would be prone to error. Allowing the engine to consider this many possibilities would also slow the engine down, as it would require more computational processing.

Another approach to inputting all the possible combinations into the design engine is to, for instance, select fifty top usage configurations that a customer tends to order. However, this approach means that oftentimes the manufacturer could use inventory to build a particular drawer combination, and run out of one or more of the particular electronic modules in that combination needed as part of the top configurations selected. However, there could be other modules that could be used in place of the out of stock module. In such a case, a substitution rule could be applied. The substitution rule(s) though could often result in violating the plug plan from above. This is because, in the current scenario, the design engine cannot distinguish between the different sockets. Due to this, an incorrect substitution could be made, which could result in incorrect component needs, such as lament, wafer, tooling capacity, etc., which typically have long lead times. Alternatively, proceeding with the initial approach of inputting all the possible combinations into the design engine would result in a large amount of processing being need, which could slow down the engine significantly, and result in the design system failing to transfer data in a timely manner to other systems. Disclosed herein are methods, computer program products, and computer systems that enable a user to tailor each electronic assembly (e.g., drawer) to the specific needs or preferences for that assembly, while also adhering to the necessary constraints.

As a detailed example, FIG. 5A depicts six ways of building a 57W assembly with three different power constraint offerings. FIG. 5B further depicts one example of a drawer plug plan, where the different rows illustrate different possible electronic modules assembly configurations. As an example, assume that the design engine specifies twenty drawers to be built using:

(14M+14M+14L+15L)×10 (power constraint not violated)

(15M+15 H+14L+15L)×6 (power constraint not violated)

(15L+15L+15M+15L)×4 (power constraint not violated)

After building twenty drawers, the 15L electronic modules are out of stock, with the design engine building the next ten drawers using 15H, such as:

(14M+14H+14L+15H)×6 (power constraint not violated)

(15M+15H+14L+15H)×4 (power constraint not violated)

After thirty drawers are fabricated, assume that the 15H module is also out of stock, but other modules are available. To build the next twenty drawers, the design engine could start substituting 15M in Socket D as follows:

(14M+14M+14L+15M)×10 (power constraint violated)

(15M+15H+14L+15M)×10 (power constraint violated)

However, as noted, this results in the power constraint being violated. In this scenario, it is acceptable for Socket B to be able to use 15M in place of 15H, but Socket D can not use 15M in place of 15H. Thus, the substitution rules that are applied universally are incorrect since the design engine does not have an understanding of the drawer structure and that each socket requires a different set of substitution rules. Simply because 15M is used in Socket B does not mean it can be used in Socket D while still meeting a power constraint(s) for the electronic assembly.

The result of the above example is that the design engine is unable to correctly plan, for instance, for the needs of wafers and supporting components to fabricate the specified or desired electronic assemblies. For instance, instead of using 15M modules in the above example after running out of the 15H modules, the design engine should automatically initiate fabrication of additional wafers to produce the needed 15H modules. Currently, the same substitution rules are used across all the sockets of the electronic assembly, and there is no differentiation of different rules for different sockets.

Advantageously, the methods, computer program products and computer systems disclosed herein allow electronic modules to be released in a manner that establishes supply-demand synchronization, while following plug plan rules to optimally establish wafers and other component needed, along with capacity. The methods, computer program products and computer systems disclosed reduce the amount of data needed to be input to, for instance, a design engine or agent, and also decrease computational processing required by the design engine, while providing an optimal supply solution where every possible combination is considered. In one or more embodiments, an accurate module release plan is generated in such a manner that establishes supply and/or demand synchronization while following the plug plan rules that optimally establish the correct wafer and other component requirements. The processes disclosed herein advantageously reduce the amount of rows of data required to be input into a design engine (or agent, tool), and allows the design engine to run more efficiently, with less processing time. This allows for quicker turnaround in the design process and quicker simulating of what if analysis. Also, should the design engine run too long to timely generate the desired electronic module assembly configurations, the engine could miss a required data feed schedule in the design and fabrication process flow.

In accordance with one or more aspects disclosed herein, each socket in an electronic assembly, or electronic assembly design, is represented uniquely and accounted for within the generated electronic module assembly configurations. Advantageously, the generated socket-dependent substitution rules disclosed herein are used to automatically generate an updated electronic module assembly configuration with acceptable substitutions for modules in a configuration, for instance, in order to optimize inventory consumption in a fabrication process flow.

Figure 6A:
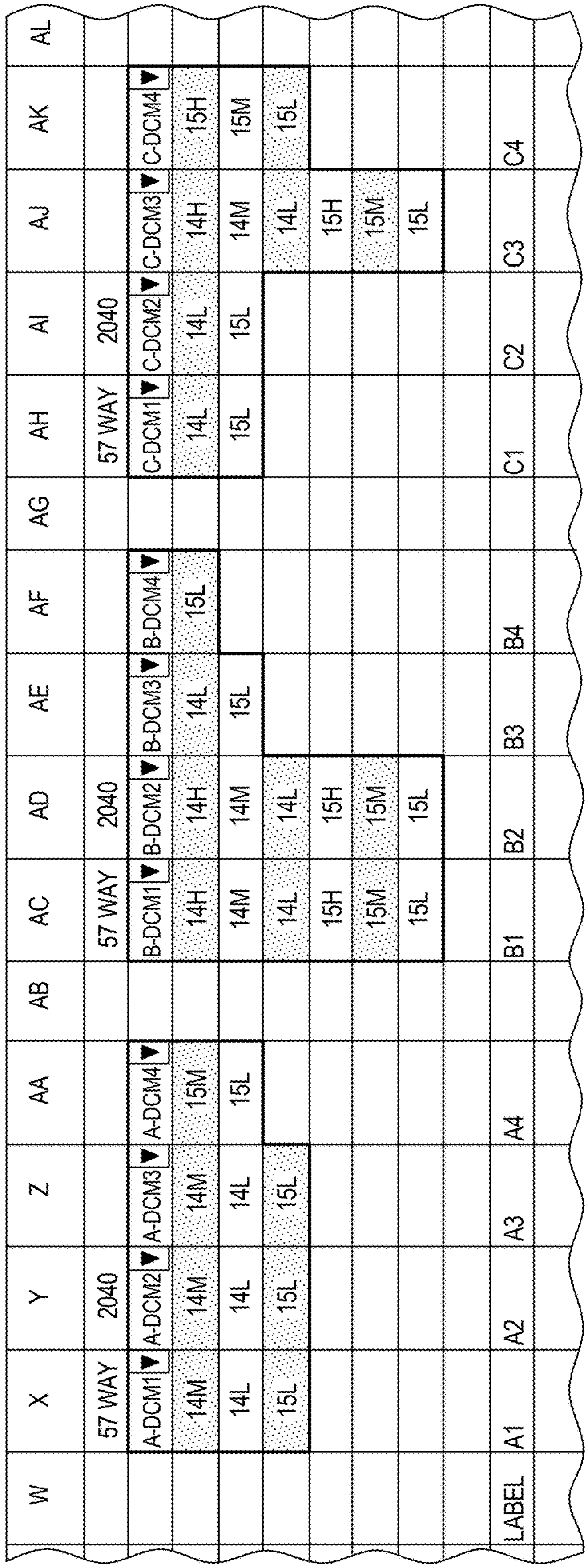
FIG. 6A illustrates example electronic module assembly configurations for different potential electronic assembly design implementations, in accordance with one or more aspects of the present disclosure.

In one or more embodiments, to obtain socket-dependent substitution rules for a power-constrained electronic assembly design, the electronic assembly data (e.g., drawer data) is considered. The data is analyzed by the assembly engine to understand how many different offerings and how many different configurations there are within a given offering of an electronic assembly (e.g., drawer) that can be built. The number of offerings is referred to as lv 90 inputs in this example, and the various ways or configurations of building a particular offering are referred to herein as the lv 91 inputs. In this scenario, level 90 is the parent level of level 91. By way of example, FIG. 6A illustrates electronic module assembly configurations for a 2040W power-constrained (or specified) drawer, where there are three approaches to building the drawer, with the different approaches having different possible configurations, such as illustrated in FIG. 6A. Note that other power rated drawers would have different electronic module assembly configurations associated with them as initial input. In this example, once the noted data is understood by the design engine (e.g., that there are three level 90s and a total of six level 91s), unique identifiers (such as part numbers) can be assigned so they can be represented in the design engine. In one or more embodiments, part numbers can be one way of representing information within the design engine. In the example of FIG. 6B, 57 WAY represents the amount of cores in the drawer, with different power classifications being possible. In this example, there are three types of 57W, that is, high, medium and low power. In the example of FIG. 6B, there are three ways to build the high power 57W, and only way of building the medium and low power 57W. This means that the lv 90 representing 57W high power drawer, will have three lv 91. In the example illustrated, lv 90 is assigned the following part number: ZADR57H representing the high power drawer lv 90, ZADR57M representing the medium power drawer lv 90, and ZADR57L representing the low power drawer lv 90. As illustrated in FIG. 6B, the lv 90 high power design has three additional part numbers as its child configurations, since there are three ways of building that particular lv 90 design. These are represented by ZADR57H1, ZADR57H2 & ZADR57H3. For simplicity, one build path for ZADR57H1 is considered below, which is a lv 91 subset of lv 90 ZADR57H. Obtaining the unique configuration identifiers for each electronic module assembly configuration means that the list of materials can be created from these identifiers and uploaded into the design engine.

In one or more embodiments, sockets for the lv 91 level are defined or identified by a respective unique socket identifier. For instance, in the four socket drawer example of FIG. 4, four lv 01 socket identifiers or part numbers are assigned to the respective four sockets of a given drawer for a particular configuration. These identifiers do not represent actual modules as they are not finished good inventory module pins, but rather they represent individual sockets within an assembly configuration. The lv 01 socket identifiers are associated with or connected to the respective lv 91 identifiers, which are represented through the lv 01 socket identifiers. This can be done via the materials assembly. The process is completed for all lv 91s, and their respective lv 01 sockets. This enables representation of each socket within a configuration design uniquely from one another, which previously was not possible. One embodiment of four unique socket identifiers, for the example of FIG. 6B, is depicted in FIG. 6C, by way of example only. Specifically, four part numbers or unique identifiers are generated to represent the four sockets for the noted drawer configurations, such as: 03LV024, 03LV025, 03LV026 and 03LV027. These four unique identifiers, or part numbers, are connected, or associated, to the respective configuration identifiers or part numbers ZADR57H1, in this example. In this manner, the level 90 (ZADR57H) representing one of the high powered drawer offerings is identified, as well as the level 91 (ZADR57H1), which is one of the three ways the particular high powered drawer can be fabricated, which is further connected to the four socket lv 01 identifiers or part numbers for the respective configurations. Note that even though there are socket identifiers or part numbers, there is no inventory associated with them since they represent sockets within the drawer configurations, and the socket is an abstract concept as far as the part numbers go, not physical hardware. However, it is desirable to drive module consumption via the assigned sockets such as disclosed herein.

In one or more embodiments, for a given electronic assembly, or drawer in this example, once the respective socket identifiers are specified for a configuration, there are four unique sockets on lv 01, via the lv 01 socket identifiers, and it is necessary to create an approach for the identifiers to peg or relate to an actual lv 01 inventory module. This is accomplished via substitution rules. The substitution rule is a functionality of a design engine (or agent or tool) that enables a different module to be used in the absence of a first module, which may not be available in the finished good inventory currently. To illustrate this logic, consider a need to ship fifty 14C modules to a customer. After shipping thirty modules, the production system is out of 14C modules. However, there are plenty of 15C modules in finished goods inventory, which is also acceptable in place of 14C. In order for the design engine to send the remainder of the twenty modules of 15C, and net the inventory off correctly, it is necessary to input a substitution rule that indicates that it is acceptable to send a 15C module instead of a 14C module. After the rule is implemented, the design engine will automatically create a supple solution where thirty of the fifty modules ordered are satisfied using 14C, and the remainder of the twenty modules are satisfied using 15C. Therefore, in one or more embodiments, since the lv 01 socket identifiers are used to define each socket uniquely, this can be leveraged in the substitution rule to create a series of rules for each socket of the electronic assembly design, which can be the same or different from one another. This results in the design engine accurately substituting correct modules for a given socket, without violating the associated power constraint(s) of the electronic assembly design. With this connection, the remainder of the available electronic modules can be used to drive fabrication, without inputting all the different permutations noted previously, which advantageously returns a faster result then the initially-noted approach.

In one or more embodiments, a further step includes fabricating a physical integrated circuit in accordance with an optimized circuit device design and/or an optimized electronic assembly design. One non-limiting specific example that accomplishes this is described herein in connection with FIGS. 7-9. For example, a multi-processor module structure is provided to fabrication equipment to facilitate fabrication of a physical electronic module type in accordance with the design structure.

In one or more embodiments, a layout is prepared based on the analysis. In one or more embodiments, the layout is instantiated as a design structure. In one or more embodiments, a physical integrated circuit is fabricated in accordance with the design structure.

Figure 7:
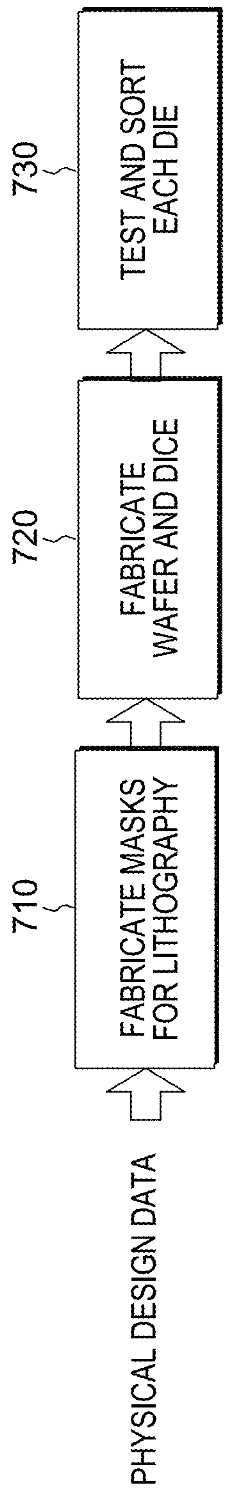
FIG. 7 is a flow diagram of a design process used in semiconductor design, manufacture, and test, in which aspects of the present disclosure can be employed.
Figure 8:
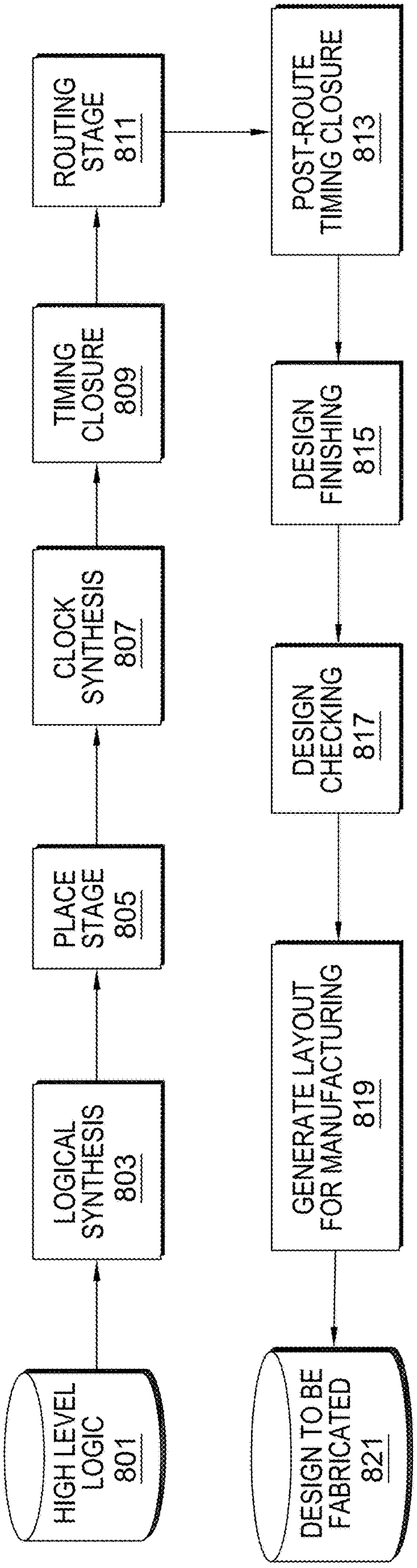
FIG. 8 depicts a further example of integrated circuit fabrication, in accordance with one or more aspects of the present disclosure.
Figure 9:
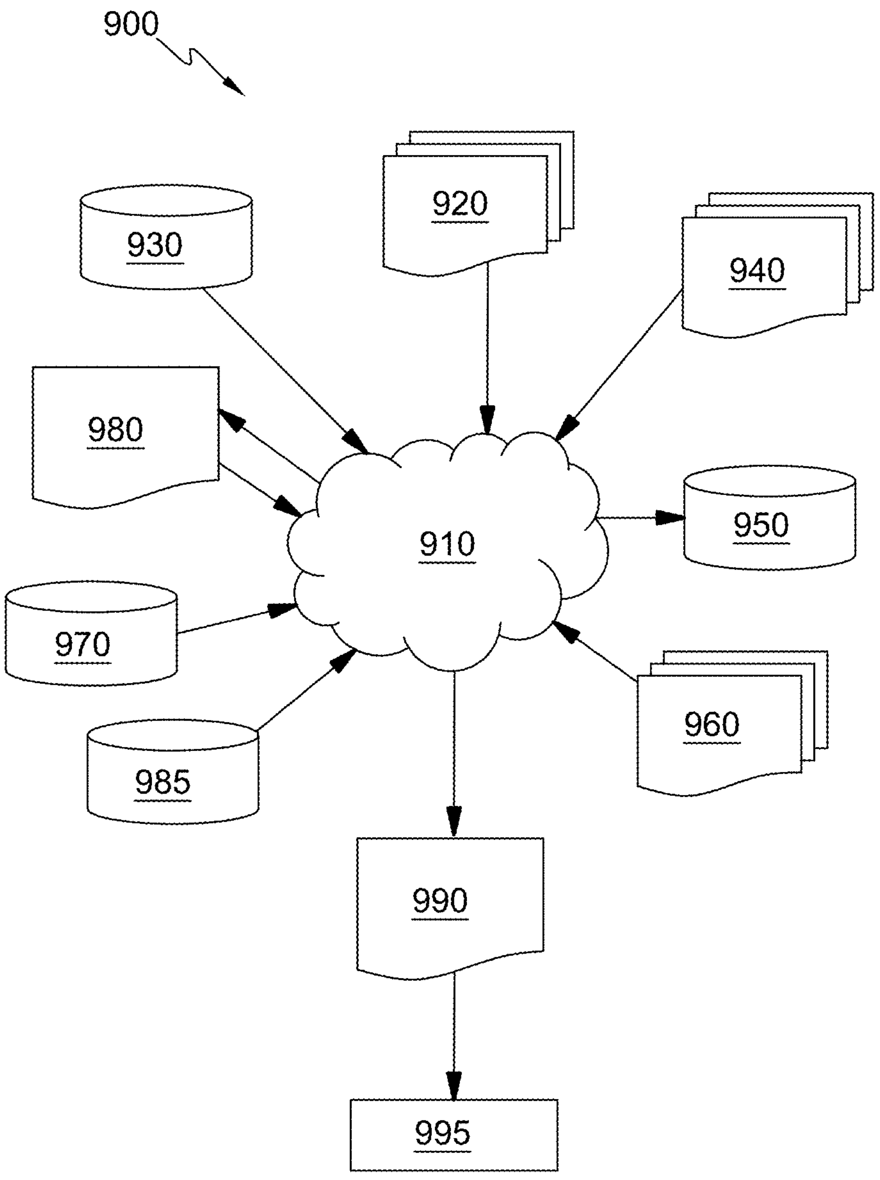
FIG. 9 shows an exemplary high-level electronic design automation (EDA) tool flow, in which aspects of the present disclosure can be implemented.

In one or more embodiments, the layout is instantiated as a design structure. A physical integrated circuit is then fabricated in accordance with the design structure, such as depicted in FIGS. 7-9. FIG. 7 is a flow diagram of a design process used in semiconductor design, manufacture, and/or test. Once the physical design data is obtained, an integrated circuit designed in accordance therewith can be fabricated according to known processes that are generally described with reference to FIG. 7. Generally, a wafer with multiple copies of the final design is fabricated and cut (i.e., diced) such that each die is one copy of the integrated circuit. At block 710, the processes include fabricating masks for lithography based on the finalized physical layout. At block 720, fabricating the wafer includes using the masks to perform photolithography and etching. Once the wafer is diced, testing and sorting each die is performed at 730 to filter out any faulty die. Furthermore, referring to FIGS. 7-9, in one or more embodiments, at least one processor is operative to generate a design structure for the integrated circuit design in accordance with the VLSI design, and in at least some embodiments, the at least one processor is further operative to control integrated circuit manufacturing equipment to fabricate a physical integrated circuit in accordance with the design structure. Thus, the layout can be instantiated as a design structure, and the design structure can be provided to fabrication equipment to facilitate fabrication of a physical integrated circuit in accordance with the design structure. The physical integrated circuit production will be improved (for example, because of the obtained socket-dependent substitution rules) compared to production of circuits designed using prior art techniques. To achieve similar improvements with prior-art techniques, even if possible, would require expenditure of more CPU time as compared to embodiments of the invention.

FIG. 8 depicts an example high-level Electronic Design Automation (EDA) tool flow, which is responsible for creating an optimized microprocessor (or other IC) design to be manufactured. A designer can start with a high-level logic description 801 of the circuit (e.g. VHDL or Verilog). The logic synthesis tool 803 compiles the logic and optimizes it without any sense of its physical representation, and with estimated timing information. Placement tool 805 takes the logical description and places each component, looking to minimize congestion in each area of the design. The clock synthesis tool 807 optimizes the clock tree network by cloning/balancing/buffering the latches or registers. The timing closure step 809 performs a number of optimizations on the design, including buffering, wire tuning, and circuit repowering; its goal is to produce a design which is routable, without timing violations, and without excess power consumption. Routing stage 811 takes the placed/optimized design and determines how to create wires to connect the components, without causing manufacturing violations. Post-route timing closure 813 performs another set of optimizations to resolve any violations that are remaining after the routing. Design finishing 815 then adds extra metal shapes to the netlist, to conform with manufacturing requirements. Checking steps 817 analyze whether the design is violating any requirements such as manufacturing, timing, power, electromigration or noise. When the design is clean, the final step 819 is to generate a layout for the design, representing all the shapes to be fabricated in the design to be fabricated 821.

One or more embodiments integrate the design techniques herein with semiconductor integrated circuit design and module assembly simulation, test, layout, and/or manufacture. In this regard, FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of design structures and/or devices, such as those that can be analyzed using timing analysis or the like. The design structures processed and/or generated by design flow 900 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, assembly, or system. For example, machines may include: lithography machines, machines and/or equipment for generating masks (e.g., E-V writers), computers, or equipment for simulating design structures, any apparatus used in the manufacturing or test process, or any machines for programming functionality equivalent representations of the design structures into any medium (e.g., a machine for programming a programmable gate array).

Design flow 900 can vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA).

FIG. 9 illustrates multiple such design structures 920 that is preferably processed by a design process 910. Design structure 920 may be a logical simulation design structure generated and processed by design process 910 to product a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD), such as implemented by a core developer/designer. When encoded on a gate array or storage medium, design structure 920 may be accessed and processed by one or more hardware and/or software modules within design process 910 to simulate or otherwise functionally represent an electronic component, circuit, electronic or logic module, apparatus, device, or system. As such, design structure 920 may comprise files or other data structures including human and/or machine-readable source code, compiled structures, and computer executable code structure that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages, such as Verilog and VHDL, and/or higher level design languages, such as C or C++.

Design process 910 preferably employs and incorporates hardware and/or software modules for synthesizing, translating, or otherwise processing a design/simulation functional equivalent of components, circuits, devices, assemblies, or logic structures to generate a Netlist 980, which may contain design structures such as design structure 920. Netlist 980 may include, for example, compiled or otherwise processed data structures representing a list of wires, discrete components, logic gates, control circuits, I/O devices, modules, module assemblies, etc., that describes the connections to other elements and circuits in an integrated circuit design. Netlist 980 may be recorded on a machine-readable data storage medium or programmed into a programmable gate array, a compact flash, or other flash memory. Additionally, or in the alternative, the medium may be a system or cache memory, buffer space, or other suitable memory.

Design process 910 may include hardware and software modules for processing a variety of input data structure system, including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985, which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc. Improved design and placement can be performed as described herein.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably includes one or more files, data structures, or other computer-encoded data or instructions that reside on data storage media and that when processed by an ECAD system generate a logically or otherwise functionally equivalent form of one or more IC designs or the like. In one embodiment, design structure 990 may include a compiled, executable HDL simulation model that functionally simulates the devices to be analyzed.

Design structure 990 may also employ a data format used for the exchange of layout data of integrated circuits. and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device, assembly, or structure as described herein (e.g., .lib files). Design structure 990 may then proceed to a stage 995 where, for example, design structure 990: proceeds to tape-out, is released to manufacturing, is released to a mask house, is sent to another design house, is sent back to the customer, etc.

In addition to the above, one or more aspects may be provided, offered, deployed, managed, serviced, etc. by a service provider who offers management of customer environments. For instance, the service provider can create, maintain, support, etc. computer code and/or a computer infrastructure that performs one or more aspects for one or more customers. In return, the service provider may receive payment from the customer under a subscription and/or fee agreement, as examples. Additionally, or alternatively, the service provider may receive payment from the sale of advertising content to one or more third parties.

In one aspect, an application may be deployed for performing one or more embodiments. As one example, the deploying of an application comprises providing computer infrastructure operable to perform one or more embodiments.

As a further aspect, a computing infrastructure may be deployed comprising integrating computer-readable code into a computing system, in which the code in combination with the computing system is capable of performing one or more embodiments.

Yet a further aspect, a process for integrating computing infrastructure comprising integrating computer-readable code into a computer system may be provided. The computer system comprises a computer-readable medium, in which the computer medium comprises one or more embodiments. The code in combination with the computer system is capable of performing one or more embodiments.

Although various embodiments are described above, these are only examples. For example, other models and/or weather data may be used. Moreover, additional, less and/or other code may be used. Although particular code may be provided as an example of performing a particular operation or task, additional and/or other code may be used. Code may be combined and/or separated into code subsets. Many variations are possible.

Various aspects and embodiments are described herein. Further, many variations are possible without departing from a spirit of aspects of the present disclosure. It should be noted that, unless otherwise inconsistent, each aspect or feature described and/or claimed herein, and variants thereof, may be combinable with any other aspect or feature.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A method comprising:

obtaining, by an assembly design engine, socket-dependent substitution rules for a power-constrained electronic assembly design indicating where a different electronic module type of a plurality of electronic module types can be used in place of another electronic module type at a particular socket in an electronic module assembly configuration absent violating a power constraint of the electronic assembly design, wherein the electronic assembly design includes multiple electronic module sockets to accommodate multiple electronic modules of the electronic module assembly configuration;

automatically generating, by the assembly design engine, an updated electronic module assembly configuration for the electronic assembly design using at least one substitution rule of the socket-dependent substitution rules, where the other electronic module type of the electronic module assembly configuration is replaced at the particular socket of the multiple sockets with the different electronic module type of the plurality of electronic module types; and initiating fabricating of an electronic assembly using the updated electronic module assembly configuration of the electronic assembly design.

2. The method of claim 1, wherein the obtaining, by the assembly design engine, comprises:

assigning a unique configuration identifier to each electronic module assembly configuration of one or more electronic module assembly configurations of the power-constrained electronic assembly design, the electronic module assembly configuration being one electronic module assembly configuration of the one or more electronic module assembly configurations; and associating, using the unique configuration identifiers, respective socket identifiers of the multiple electronic module sockets to the one or more electronic module assembly configurations of the electronic assembly design.

3. The method of claim 2, wherein the obtaining further comprises determining, for the electronic assembly design, multiple electronic module assembly configurations, the one or more electronic module assembly configurations being one or more electronic module assembly configurations of the multiple electronic module assembly configurations.

4. The method of claim 3, wherein the multiple electronic module assembly configurations for the electronic assembly design comprise all electronic module assembly configurations for the electronic assembly design using the power constraint and the plurality of different electronic module types.

5. The method of claim 2, wherein the obtaining further comprises generating, by the assembly design engine, the socket-dependent substitution rules using the power constraint, the socket identifiers and the unique configuration identifiers.

6. The method of claim 5, wherein the generated socket-dependent substitution rules comprise one set of design engine substitution rules for one electronic module socket of the multiple electronic module sockets of the electronic assembly design and a different set of design engine substitution rules for a different electronic module socket of the multiple electronic module sockets of the electronic assembly design.

7. The method of claim 5, wherein the generating comprises generating multiple separate design engine substitution rules for each socket of the multiple sockets of the electronic assembly design using the power constraint, the socket identifiers of the multiple electronic module sockets and the unique configuration identifiers of the one or more electronic module assembly configurations.

8. The method of claim 1, wherein the obtaining, by the assembly design engine, further comprises obtaining socket-dependent substitution rules for at least one other power-constrained electronic assembly design using assigned socket identifiers for the multiple electronic module sockets of the at least one other power-constrained electronic assembly design and unique configuration identifiers for one or more electronic assembly configurations of the at least one other power-constrained electronic assembly design.

9. The method of claim 1, wherein the multiple electronic module sockets of the electronic assembly design comprise multiple processor module sockets, and the plurality of electronic module types comprise a plurality of different multi-processor module types.

10. A computer program product comprising:
one or more computer-readable storage media; and
program instructions stored on the one or more computer-readable storage media to perform operations comprising:
obtaining socket-dependent substitution rules for a power-constrained electronic assembly design indicating where a different electronic module type of a plurality of electronic module types can be used in place of another electronic module type at a particular socket in an electronic module assembly configuration absent violating a power constraint of the electronic assembly design, wherein the electronic assembly design includes multiple electronic module sockets to accommodate multiple electronic modules of the electronic module assembly configuration;
automatically generating an updated electronic module assembly configuration for the electronic assembly design using at least one substitution rule of the socket-dependent substitution rules, where the other electronic module type of the electronic module assembly configuration is replaced at the particular socket of the multiple sockets with the different electronic module type of the plurality of electronic module types; and
initiating fabricating of an electronic assembly using the updated electronic module assembly configuration of the electronic assembly design.

11. The computer program product of claim 10, wherein the obtaining comprises:
assigning a unique configuration identifier to each electronic module assembly configuration of one or more electronic module assembly configurations of the power-constrained electronic assembly design, the electronic module assembly configuration being one electronic module assembly configuration of the one or more electronic module assembly configurations; and
associating, using the unique configuration identifiers, respective socket identifiers of the multiple electronic module sockets to the one or more electronic module assembly configurations of the electronic assembly design.

12. The computer program product of claim 11, wherein the obtaining further comprises determining, for the electronic assembly design, multiple electronic module assembly configurations, the one or more electronic module assembly configurations being one or more electronic module assembly configurations of the multiple electronic module assembly configurations.

13. The computer program product of claim 11, wherein the obtaining further comprises generating the socket-dependent substitution rules using the power constraint, the socket identifiers and the unique configuration identifiers.

14. The computer program product of claim 13, wherein the generated socket-dependent substitution rules comprise one set of substitution rules for one electronic module socket of the multiple electronic module sockets of the electronic assembly design and a different set of substitution rules for a different electronic module socket of the multiple electronic module sockets of the electronic assembly design.

15. The computer program product of claim 13, wherein the generating comprises generating multiple separate substitution rules for each socket of the multiple sockets of the electronic assembly design using the power constraint, the socket identifiers of the multiple electronic module sockets and the unique configuration identifiers of the one or more electronic module assembly configurations.

16. The computer program product of claim 10, wherein the multiple electronic module sockets of the electronic assembly design comprise multiple processor module sockets, and the plurality of electronic module types comprise a plurality of different multi-processor module types.

17. A computer system comprising:
a processor set;
one or more computer-readable storage media; and
program instructions stored on the one or more computer-readable storage media to cause the processor set to perform operations comprising:
obtaining socket-dependent substitution rules for a power-constrained electronic assembly design indicating where a different electronic module type of a plurality of electronic module types can be used in place of another electronic module type at a particular socket in an electronic module assembly configuration absent violating a power rating of the electronic assembly design, wherein the electronic assembly design includes multiple electronic module sockets to accommodate multiple electronic modules of the electronic module assembly configuration;
automatically generating an updated electronic module assembly configuration for the electronic assembly design using at least one substitution rule of the socket-dependent substitution rules, where the other electronic module type of the electronic module assembly configuration is replaced at the particular socket of the multiple sockets with the different electronic module type of the plurality of electronic module types; and initiating fabricating of an electronic assembly using the updated electronic module assembly configuration of the electronic assembly design.

18. The computer system of claim 17, wherein the obtaining comprises:

assigning a unique configuration identifier to each electronic module assembly configuration of one or more electronic module assembly configurations of the power-constrained electronic assembly design, the electronic module assembly configuration being one electronic module assembly configuration of the one or more electronic module assembly configurations; and associating, using the unique configuration identifiers, respective socket identifiers of the multiple electronic module sockets to the one or more electronic module assembly configurations of the electronic assembly design.

19. The computer system of claim 18, wherein the obtaining further comprises generating the socket-dependent substitution rules using the power constraint, the socket identifiers and the unique configuration identifiers, wherein the generated socket-dependent substitution rules comprise one set of substitution rules for one electronic module socket of the multiple electronic module sockets of the electronic assembly design and a different set of substitution rules for a different electronic module socket of the multiple electronic module sockets of the electronic assembly design.

20. The computer system of claim 18, wherein the obtaining further comprises generating the socket-dependent substitution rules using the power constraint, the socket identifiers and the unique configuration identifiers, wherein the generating comprises generating multiple separate substitution rules for each socket of the multiple sockets of the electronic assembly design using the power constraint, the socket identifiers of the multiple electronic module sockets and the unique configuration identifiers of the one or more electronic module assembly configurations.

* * * * *